US012109618B2

(12) United States Patent
Ucok et al.

(10) Patent No.: US 12,109,618 B2
(45) Date of Patent: Oct. 8, 2024

(54) PROCESS AND PRINTED ARTICLE

(71) Applicant: GENERAL ELECTRIC COMPANY, Schenectady, NY (US)

(72) Inventors: Ibrahim Ucok, Simpsonville, SC (US); Yan Cui, Greer, SC (US); Srikanth Chandrudu Kottilingam, Simpsonville, SC (US); Surinder Singh Pabla, Greer, SC (US)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 190 days.

(21) Appl. No.: 17/197,266

(22) Filed: Mar. 10, 2021

(65) Prior Publication Data

US 2021/0221093 A1 Jul. 22, 2021

Related U.S. Application Data

(62) Division of application No. 15/398,972, filed on Jan. 5, 2017, now Pat. No. 10,975,719.

(51) Int. Cl.
*B32B 15/01* (2006.01)
*B22F 3/15* (2006.01)
(Continued)

(52) U.S. Cl.
CPC .............. *B22F 3/15* (2013.01); *B22F 3/24* (2013.01); *B22F 5/009* (2013.01); *B22F 5/04* (2013.01); *B22F 10/14* (2021.01); *B22F 10/28* (2021.01); *B22F 10/62* (2021.01); *B22F 10/64* (2021.01); *B23K 15/0086* (2013.01); *B23K 15/0093* (2013.01); *B23K 26/0006* (2013.01); *B23K 26/342* (2015.10); *B23K 26/70* (2015.10); *B32B 3/30* (2013.01); *B32B 15/01* (2013.01); *B33Y 10/00* (2014.12); *B33Y 40/20* (2020.01); *B33Y 70/00* (2014.12); *B33Y 80/00* (2014.12); *C22C 19/055* (2013.01); *C22C 19/056* (2013.01); *C22C 19/057* (2013.01); *C22C 19/07* (2013.01); *C22C 30/02* (2013.01); *C22C 38/002* (2013.01); *C22C 38/02* (2013.01); *C22C 38/04* (2013.01); *C22C 38/06* (2013.01); *C22C 38/08* (2013.01); *C22C 38/105* (2013.01); *C22C 38/42* (2013.01); *C22C 38/44* (2013.01); *C22C 38/48* (2013.01); *C22C 38/50* (2013.01); *C22C 38/52* (2013.01); *C23C 4/08* (2013.01); *C23C 4/134* (2016.01); *C23C 14/16* (2013.01); *C23C 14/28* (2013.01); *C23C 16/06* (2013.01); *C23C 16/44* (2013.01); *C23C 18/1637* (2013.01); *C23C 18/32* (2013.01); *F01D 5/28* (2013.01); *F01D 25/005* (2013.01); *F01D 25/24* (2013.01); *B22F 2003/242* (2013.01); *B22F 2301/15* (2013.01); *B22F 2301/35* (2013.01);
(Continued)

(58) Field of Classification Search
CPC .... B22F 3/15; B22F 3/24; B22F 5/009; B22F 5/04; B22F 10/14; B22F 10/28; B22F 10/62; B22F 10/64; B22F 2003/242; B22F 2301/15; B22F 2301/35; B22F 2998/10; B23K 15/0086; B23K 15/0093; B23K 26/0006; B23K 26/342; B23K 26/70; B23K 2101/001; B32B 3/30; B32B 15/01; B33Y 10/00; B33Y 40/20; B33Y 70/00; B33Y 80/00; C22C 19/055; C22C 19/056; C22C 19/057; C22C 19/07; C22C 30/02; C22C 38/002; C22C 38/02; C22C 38/04; C22C 38/06; C22C 38/08; C22C 38/105; C22C 38/42; C22C 38/44; C22C 38/48; C22C 38/50; C22C 38/52; C23C 4/08; C23C 4/134; C23C 4/16; C23C 4/28; C23C 16/06; C23C 16/44; C23C 18/1637; C23C 18/32; F01D 5/28; F01D 25/005; F01D 5/24; F05D 2300/17; Y02P 10/25
See application file for complete search history.

(56) References Cited

U.S. PATENT DOCUMENTS 6,413,582 B1 7/2002 Park et al.
8,109,726 B2 2/2012 Liang
(Continued)

FOREIGN PATENT DOCUMENTS

DE 102011116212 A1 * 4/2012 ............ B22F 3/1055
EP 2570595 A1 3/2013
EP 2692464 A2 2/2014

OTHER PUBLICATIONS

Office Action issued to Japanese counterpart Application No. JP2017-245719 received Oct. 26, 2021.
(Continued)

Primary Examiner — Kevin C T Li
(74) Attorney, Agent, or Firm — McNees Wallace & Nurick LLC

(57) ABSTRACT

A process includes forming a printed article having an external surface and at least one microfeature with an internal surface by additive manufacture, coating the external surface and the internal surface of the printed article with a metallic microlayer to form a coated article, and densifying the coated article to form a component. After formation, the printed article has a porosity such that the printed article is not at full density. A densified component includes a printed article having an external surface and at least one microfeature with an internal surface and a metallic microlayer coating the external surface and the internal surface of the printed article. The printed article is formed by additive manufacture.

19 Claims, No Drawings

(51) Int. Cl.

| | | |
|---|---|---|
| B22F 3/24 | (2006.01) | |
| B22F 5/00 | (2006.01) | |
| B22F 5/04 | (2006.01) | |
| B22F 10/14 | (2021.01) | |
| B22F 10/28 | (2021.01) | |
| B22F 10/62 | (2021.01) | |
| B22F 10/64 | (2021.01) | |
| B23K 15/00 | (2006.01) | |
| B23K 26/00 | (2014.01) | |
| B23K 26/342 | (2014.01) | |
| B23K 26/70 | (2014.01) | |
| B32B 3/30 | (2006.01) | |
| B33Y 10/00 | (2015.01) | |
| B33Y 40/20 | (2020.01) | |
| B33Y 70/00 | (2020.01) | |
| B33Y 80/00 | (2015.01) | |
| C22C 19/05 | (2006.01) | |
| C22C 19/07 | (2006.01) | |
| C22C 30/02 | (2006.01) | |
| C22C 38/00 | (2006.01) | |
| C22C 38/02 | (2006.01) | |
| C22C 38/04 | (2006.01) | |
| C22C 38/06 | (2006.01) | |
| C22C 38/08 | (2006.01) | |
| C22C 38/10 | (2006.01) | |
| C22C 38/42 | (2006.01) | |
| C22C 38/44 | (2006.01) | |
| C22C 38/48 | (2006.01) | |
| C22C 38/50 | (2006.01) | |
| C22C 38/52 | (2006.01) | |
| C23C 4/08 | (2016.01) | |
| C23C 4/134 | (2016.01) | |
| C23C 14/16 | (2006.01) | |
| C23C 14/28 | (2006.01) | |
| C23C 16/06 | (2006.01) | |
| C23C 16/44 | (2006.01) | |
| C23C 18/16 | (2006.01) | |
| C23C 18/32 | (2006.01) | |
| F01D 5/28 | (2006.01) | |
| F01D 25/00 | (2006.01) | |
| F01D 25/24 | (2006.01) | |
| B23K 101/00 | (2006.01) | |

(52) U.S. Cl.
CPC ..... B22F 2998/10 (2013.01); B23K 2101/001 (2018.08); F05D 2300/17 (2013.01); Y02P 10/25 (2015.11)

(56) References Cited

U.S. PATENT DOCUMENTS

| | | | |
|---|---|---|---|
| 2010/0059573 A1* | 3/2010 | Kottilingam | B23K 35/3046 228/164 |
| 2010/0183427 A1* | 7/2010 | Liang | F01D 5/187 415/115 |
| 2011/0311389 A1* | 12/2011 | Ryan | F01D 5/18 419/27 |
| 2013/0039799 A1 | 2/2013 | Bono et al. | |
| 2013/0071562 A1 | 3/2013 | Szuromi et al. | |
| 2014/0034626 A1 | 2/2014 | Illston et al. | |
| 2014/0037983 A1 | 2/2014 | Godfrey et al. | |
| 2015/0090773 A1* | 4/2015 | Schick | B23K 1/0018 228/256 |
| 2015/0144496 A1 | 5/2015 | Morris et al. | |
| 2015/0217412 A1* | 8/2015 | Liu | B23K 9/23 219/137 WM |
| 2016/0265362 A1* | 9/2016 | Slavens | B22F 3/24 |
| 2016/0354842 A1* | 12/2016 | Schick | B33Y 10/00 |

OTHER PUBLICATIONS

ExOne, "Alloy IN 625", Industrial Grade Materials for 3D Printing, ExOne.com, 2 pages, dated Aug. 14, 2014.
Lasalmonie et al., "Hot Isostatic Pressing of SY625 Powder", in Superalloys 718, 625, 706 and Various Derivatives, Loria ed., The Minerals, Metals & Materials Society, pp. 791-794, 1997.

* cited by examiner

PROCESS AND PRINTED ARTICLE

CROSS-REFERENCE TO RELATED APPLICATIONS

This application is a divisional of U.S. Utility application Ser. No. 15/398,972, filed on Jan. 5, 2017, and entitled "PROCESS AND PRINTED ARTICLE", the disclosure of which is hereby incorporated by reference in its entirety.

FIELD OF THE INVENTION

The present embodiments are directed to components and processes of forming components. More particularly, the present embodiments are directed to additively-manufactured high-temperature components having a microfeature with an internal surface with reduced porosity features and processes for forming such components.

BACKGROUND OF THE INVENTION

Components with microfeatures made by various three-dimensional (3-D) printing processes, including laser melting/sintering, electron beam melting/deposition (EBM), and binder-jet processing (BJP), usually exhibit some porosity features that occur mainly next to component surfaces, which may be external or internal surfaces of the component. Laser melting/sintering processes include direct metal laser melting (DMLM), direct metal laser sintering (DMLS), selective laser melting (SLM), and selective laser sintering (SLS).

3-D printed gas turbine components with intricate microfeatures, such as microchannels, are especially prone to this surface porosity due to the increased surface area and small feature size of the intricate features. These near-surface "porosity features", occurring at microchannel walls immediately next to flow surfaces, may affect component life and performance, especially fatigue, in operation and should be mitigated.

Porosity at or near component surfaces makes healing by hot isostatic pressing (HIP) impossible, because these porosity features are most likely connected to the surface and are therefore not sealed.

To address the near-surface porosity features, conventional processes use infiltration by a low-melting point alloy, but this process may degrade the properties of the 3-D printed parent alloy, making the process unsuitable for high temperature applications.

BRIEF DESCRIPTION OF THE INVENTION

In an embodiment, a process includes forming a printed article having an external surface and at least one microfeature with an internal surface by additive manufacture, coating the external surface and the internal surface of the printed article with a metallic microlayer to form a coated article, and densifying the coated article to form a component. After formation, the printed article has a porosity such that the printed article is not at full density.

In another embodiment, a densified component includes a printed article having an external surface and at least one microfeature with an internal surface and a metallic microlayer coating the external surface and the internal surface of the printed article. The printed article is formed by additive manufacture. After formation, the printed article has a porosity such that the printed article is not at full density.

Other features and advantages of the present invention will be apparent from the following more detailed description, taken in conjunction with the accompanying drawings which illustrate, by way of example, the principles of the invention.

DETAILED DESCRIPTION OF THE INVENTION

Provided is additively-manufactured high-temperature components having microfeatures with internal surfaces with reduced porosity features and processes of forming such components.

Embodiments of the present disclosure, for example, in comparison to concepts failing to include one or more of the features disclosed herein, provide high-temperature components with low-porosity microfeatures, provide surface sealing for hot isostatic pressing, enable hot isostatic pressing of high-temperature, additively-manufactured components having microfeatures, provide components having microfeatures with superior material properties, effectively employ hot isostatic pressing on high-temperature, additively-manufactured components having microfeatures, effectively seal porous surfaces of high-temperature, additively-manufactured components having microfeatures, enable hot isostatic pressing of additively-manufactured components having microfeatures and internal intricate features, enable a combination of high density and good mechanical properties in a component, encourage more widespread use of binder-jet processing, improve applicability of three-dimensional (3-D) printing for faster, larger, low-cost formation of prototype components and gas turbine components, or combinations thereof.

A process preferably includes forming an article having at least one microfeature with an internal surface by additive manufacturing, coating the surfaces of the formed article, including the surfaces of the microfeature, with a microlayer coating to seal the formed article, and densifying the sealed article.

Additive Manufacture

In some embodiments, the additively-manufactured article is a component. In some embodiments, the component is a gas turbine component. In some embodiments, the gas turbine component is a nozzle, a shroud, or a blade with microfeatures and/or complex internal features. In some embodiments, the component is a pre-sintered preform (PSP). In some embodiments, the microfeatures include microchannels.

In some embodiments, the additively-manufactured article is three-dimensionally printed. In some embodiments, the 3-D printing process includes a powder bed. In some embodiments, the 3-D printing process includes direct metal laser sintering (DMLS). In some embodiments, the 3-D printing process includes selective laser melting (SLM). In some embodiments, the 3-D printing process includes electron beam melting (EBM).

In some embodiments, the 3-D printing process includes binder-jet processing (BJP). BJP is a low-cost, high-productivity process compared to 3-D laser printing or electron beam melting processes. In BJP, a liquid binding agent is selectively applied to bind powder particles together. As such, no heat source is used during the build itself. The laser or electron beam heat source used with other additive manufacturing techniques may cause residual stresses in the additively-manufactured article. After the BJP build, the article is subjected to a de-binding step to remove the binder and a sintering step to complete the additive manufacturing process. The de-binding step may include heating the article to gasify the binder or submerging the article to dissolve the binder.

In some embodiments, the additively-manufactured article is formed of a superalloy. The article is preferably formed of a high-temperature superalloy by 3-D printing. In some embodiments, the high-temperature superalloy is a non-weldable superalloy. In some embodiments, the high-temperature superalloy is formed from a superalloy powder of Mar-M-247, René-108, GTD-444, IN-738, GTD-111, René-142, René-N2, GTD-262, FSX-414, HS-188, L605, Mar-M-509, Alloy 901, 17-4PH, an iron-based superalloy, or a combination thereof. Such superalloys are preferably consolidated further by hot isostatic pressing and are preferably not processed by 3-D laser or EB melting methods due to microcracking. In some embodiments, processes make these alloys into 3-D components without sacrificing mechanical properties or density.

As used herein, "Mar-M-247" refers to an alloy including a composition, by weight, of between about 9.3% and about 9.7% tungsten (W), between about 9.0% and about 9.5% cobalt (Co), between about 8.0% and about 8.5% chromium (Cr), between about 5.4% and about 5.7% aluminum (Al), about 3.2% tantalum (Ta), about 1.4% hafnium (Hf), up to about 0.25% silicon (Si), up to about 0.1% manganese (Mn), between about 0.06% and about 0.09% carbon (C), incidental impurities, and a balance of nickel (Ni).

As used herein, "Rene-108" refers to an alloy including a composition, by weight, of between about 9% and about 10% Co, between about 9.3% and about 9.7% W, between about 8.0% and about 8.7% Cr, between about 5.25% and about 5.75% Al, between about 2.8% and about 3.3% Ta, between about 1.3% and about 1.7% Hf, up to about 0.9% titanium (Ti) (for example, between about 0.6% and about 0.9% Ti), up to about 0.6% molybdenum (Mo) (for example, between about 0.4% and about 0.6% Mo), up to about 0.2% iron (Fe), up to about 0.12% Si, up to about 0.1% Mn, up to about 0.1% copper (Cu), up to about 0.1% C (for example, between about 0.07% and about 0.1% C), up to about 0.1% niobium (Nb), up to about 0.02% zirconium (Zr) (for example, between about 0.005% and about 0.02% Zr), up to about 0.02% boron (B) (for example, between about 0.01% and about 0.02% B), up to about 0.01% phosphorus (P), up to about 0.004% sulfur (S), incidental impurities, and a balance of Ni.

As used herein, "GTD-444" refers to an alloy including a composition, by weight, of about 9.75% Cr, about 7.5% Co, about 4.2% Al, about 3.5% Ti, about 4.8% Ta, about 6% W, about 1.5% Mo, up to about 0.5% Nb, up to about 0.2% Fe, up to about 0.2% Si, up to about 0.15% Hf, up to about 0.08% C, up to about 0.009% Zr, up to about 0.009% B, incidental impurities, and a balance of Ni.

As used herein, "IN-738", also known as "INCONEL 738", refers to an alloy including a composition, by weight, of between about 15.7% and about 16.3% Cr, about 8.0% to about 9.0% Co, between about 3.2% and about 3.7% Ti, between about 3.2% and about 3.7% Al, between about 2.4% and about 2.8% W, between about 1.5% and about 2.0% Ta, between about 1.5% and about 2.0% Mo, between about 0.6% and about 1.1% Nb, up to about 0.5% Fe, up to about 0.3% Si, up to about 0.2% Mn, between about 0.15% and about 0.20% C, between about 0.05% and about 0.15% Zr, up to about 0.015% S, between about 0.005% and about 0.015% B, incidental impurities, and a balance of Ni.

As used herein, "GTD-111" refers to an alloy including a composition, by weight, of between about 13.70% and about 14.30% Cr, between about 9.0% and about 10.0% Co, between about 4.7% and about 5.1% Ti, between about 3.5% and about 4.1% W, between about 2.8% and about 3.2% Al, between about 2.4% and about 3.1% Ta, between about 1.4% and about 1.7% Mo, about 0.35% Fe, about 0.3% Si, about 0.15% Nb, between about 0.08% and about 0.12% C, about 0.1% Mn, about 0.1% Cu, about 0.04% Zr, between about 0.005% and about 0.020% B, about 0.015% P, about 0.005% S, incidental impurities, and a balance of Ni.

As used herein, "Rene-142" refers to an alloy including a composition, by weight, of about 12% Co, about 6.8% Cr, about 6.4% Ta, about 6.1% Al, about 4.9% W, about 2.8% rhenium (Re), about 1.5% Mo, about 1.5% Hf, about 0.12% C, about 0.02% Zr, about 0.015% B, incidental impurities, and a balance of Ni.

As used herein, "Rene-N2" refers to an alloy including a composition, by weight, of about 13% Cr, about 7.5% Co, about 6.6% Al, about 5% Ta, about 3.8% W, about 1.6% Re, about 0.15% Hf, incidental impurities, and a balance of Ni.

As used herein, "GTD-262" refers to an alloy including a composition, by weight, of about 22.5% Cr, about 19% Co, about 2% W, about 1.35% Nb, about 2.3% Ti, about 1.7% Al, about 0.1% C, incidental impurities, and a balance of Ni.

As used herein, "FSX-414" refers to an alloy including a composition, by weight, of about 29% Cr, about 10% Ni, about 7% W, about 1% Fe, about 0.7% Mn, about 0.75% Si, about 0.25% C, about 0.01% B, incidental impurities, and a balance of Co.

As used herein, "HS-188" refers to an alloy including a composition, by weight, of between about 21% and about 23% Cr, between about 20% and about 24% Ni, between about 13% and about 15% W, up to about 3% Fe, up to about 1.25% Mn, between about 0.2% and about 0.5% Si, between about 0.05% and about 0.15% C, between about 0.03% and about 0.12% lanthanum (La), up to about 0.02% P, up to about 0.015% B, up to about 0.015% S, incidental impurities, and a balance of Co.

As used herein, "L605" refers to an alloy including a composition, by weight, of between about 19% and about 21% Cr, between about 14% and about 16% W, between about 9% and about 11% Ni, up to about 3% Fe, between about 1% and about 2% Mn, between about 0.05% and about 0.15% C, up to about 0.4% Si, up to about 0.04% P, up to about 0.03% S, incidental impurities, and a balance of Co.

As used herein, "Mar-M-509" refers to an alloy including a composition, by weight, of between about 22.5% and about 24.25% Cr, between about 9% and about 11% Ni, between about 6.5% and about 7.5% W, between about 3% and about 4% Ta, up to about 0.3% Ti (e.g., between about 0.15% and about 0.3% Ti), up to about 0.65% C (e.g., between about 0.55% and about 0.65% C), up to about 0.55% Zr (e.g., between about 0.45% and about 0.55% Zr), incidental impurities, and a balance of Co.

As used herein, "Alloy 901" refers to an alloy including a composition, by weight, of about 42.5% Ni, about 12.5% Cr, about 5.75% Mo, about 2.9% Ti, up to about 1% Co, up to about 0.5% Cu, up to about 0.5% Mn, up to about 0.4% Si, up to about 0.35% Al, up to about 0.1% C, up to about 0.03% S, incidental impurities, and a balance of Fe.

As used herein, "17-4PH" refers to an alloy including a composition, by weight, of between about 15% and about 17.5% Cr, between about 3% and about 5% Ni, between about 3% and about 5% Cu, up to about 1% Mn, up to about 1% Si, between about 0.15% and about 0.45% Nb plus Ta, up to about 0.07% C, up to about 0.04% P, up to about 0.03% S, incidental impurities, and a balance of Fe.

Surface Sealing

After formation of the additively-manufactured article, a coating is preferably applied to the surfaces of the article to seal the surfaces. The coating is preferably a microlayer coating. In some embodiments, the process seals external and internal surfaces of the additively-manufactured article. In some embodiments, the coating seals the inherent surface-connected porosity of the microfeatures of the additively-manufactured article.

Sealing internal surfaces of articles having microfeatures is challenging, because many coating processes, such as, for example, electron beam physical vapor deposition (EB-PVD), are based on line-of-sight, and direct access to the internal surfaces is not available. In some embodiments, special procedures seal surfaces of components with internal channels. When the coating method is a line-of-sight coating method, the flow of coating material is preferably oriented to deposit not only on external surfaces but also internal surfaces of the article, such as microfeatures surfaces, so that the article is sealed. In some embodiments, the coating species (the vapor in EB-PVD) is directed towards the internal surfaces by use of a gas jet assisting flow.

In some embodiments, the sealing is done with plasma spray physical vapor deposition (PVD) to direct the coating material onto desired non-line-of-sight (NLOS) surfaces. Plasma spray PVD is a hybrid process combining a plasma spray method and a PVD method that is done at much lower pressures compared to low pressure plasma spray (LPPS) but at higher pressures than used in PVD.

In some embodiments, the coating composition is nickel-based, cobalt-based, or iron-based. When the composition of the additively-manufactured article is nickel-based or cobalt-based, the coating composition is preferably nickel-based or cobalt-based. When the composition of the additively-manufactured article is iron-based, the coating composition is preferably iron-based, nickel-based, or cobalt-based.

In some embodiments, the coating is applied by plating, PVD, EB-PVD, chemical vapor deposition (CVD), thermal spraying, cold spraying, plasma spraying, cathodic arc, spark plasma sintering, plasma spray PVD, or a combination thereof.

In some embodiments, the internal and external surfaces of an additively-manufactured superalloy article in the laser-melted or sintered condition are coated by electroless plating. Electroless plating is an auto-catalytic chemical deposition technique. In some embodiments, the electroless plating is electroless nickel plating (E-Ni plating).

In some embodiments, the plating solution is circulated to coat the microchannel internal surfaces. The circulating may include pumping the plating solution continuously through microchannels. In some embodiments, a layer thickness in the range of about 30.5 μm (1.2 mil) to about 63.5 μm (2.5 mil) seals the surfaces. In some embodiments, the surface coating is deposited at a rate of about 25 μm (1 mil) per hour.

In some embodiments, a component with microfeatures is coated by a pure nickel or a Ni-based alloy coating in a chemical vapor deposition (CVD) reactor to achieve a coating thickness in the range of about 30.5 μm (1.2 mil) to about 63.5 μm (2.5 mil). In some embodiments, the CVD reactor is a specially-designed low-pressure CVD reactor for coating the microfeatures. In some embodiments, the CVD operates at a pressure in the range of about 10 Pa (75 mTorr) to about 1000 Pa (7.5 Torr) at a temperature greater than about 590° C. (1100° F.). The combination of the low pressure and high temperature encourages good surface coverage and a substantially uniform coating thickness over the entire component, including any microfeatures.

In some embodiments, the surface is sealed with a high-temperature braze having a melting point temperature greater than the temperature at which the densification is performed. The braze may be applied as a braze powder, placed as a tape or a paste, or the braze may be thermally or cold-sprayed onto the surfaces of the article.

In some embodiments, the high-temperature braze composition includes a nickel-based braze filler alloy a cobalt-based braze filler alloy, a gold braze filler alloy, or a combination thereof. In some embodiments, the high-temperature braze composition includes a filler alloy of American Welding Society (AWS) 5.8 BNi-2, AWS 5.8 BNi-5, AWS BNi-9, Amdry® B-93 (Sulzer Metco Management, AG, Winterthur, Switzerland), Amdry® DF4B, AWS A5.8 BCo-1, AWS 5.8 BAu, or a combination thereof.

As used herein, "AWS 5.8 BNi-2" refers to an alloy including a composition, by weight, of about 3% Fe, about 3.1% B, about 4.5% Si, about 7% Cr, incidental impurities, and a balance of Ni.

As used herein, "AWS 5.8 BNi-5" refers to an alloy including a composition, by weight, of about 10% Si, about 19% Cr, incidental impurities, and a balance of Ni.

As used herein, "AWS BNi-9" refers to an alloy including a composition, by weight, of about 15% Cr, about 3% B, incidental impurities, and a balance of Ni.

As used herein, "Amdry® B-93" refers to an alloy including a composition, by weight, of about 14% Cr, about 9.5% Co, about 4.9% Ti, about 4.0% W, about 4.0% Mo, about 4.0% Al, about 4.5% Si, about 0.7% B, incidental impurities, and a balance of Ni.

As used herein, "Amdry® DF4B" refers to an alloy including a composition, by weight, of about 14% Cr, about 10% Co, about 3.5% Al, about 2.5% Ta, about 2.75% B, about 0.05% yttrium (Y), incidental impurities, and a balance of Ni.

As used herein, "AWS A5.8 BCo-1", refers to an alloy including a composition, by weight, of about 0.4% C, about 19% Cr, about 8% Si, about 4% W, about 17% Ni, incidental impurities, and balance of Co.

As used herein, "AWS 5.8 BAu", refers to an alloy including a composition, by weight, of about 22% Ni, about 8% palladium (Pd), incidental impurities, and a balance of gold (Au).

The layer preferably covers all of the pores at the component surfaces, thereby sealing the surface-connected porosity to facilitate consolidation of porosity by densification. Upon completion of sealing by coating, the component is preferably rinsed in water and dried completely before being subjected to densification to close all or substantially all surface porosity.

Densification

After application of a coating to the surfaces of the article to seal the surfaces, the article is subjected to a densification to eliminate or substantially eliminate the internal porosity. In some embodiments, after application of braze filler material at or near the surfaces that have porosity, at least some or all of the densification occurs during the brazing that is performed at an elevated temperature, during which the braze filler flows and fills the porosity and also seals the surface. In some embodiments, such brazing may get porous section to full density such that the brazing alone mitigates the near surface porosity. In some embodiments, the densification includes a hot isostatic pressing (HIP) to eliminate or substantially eliminate the surface porosity.

As used herein, "hot isostatic pressing" or "HIP" refers to a process to reduce the porosity of a metal and improve the mechanical properties by subjecting the metal to an elevated temperature and an elevated substantially constant pressure in a high pressure vessel with an inert gas atmosphere. In some embodiments, the HIP includes treating the component for 3-5 hours at an elevated temperature of between 1150° C. and 1260° C. (2100° F. and 2300° F.) and an elevated pressure of between 68.95 MPa and 172.4 MPa (10,000 PSI and 25,000 PSI).

In some embodiments, the densification increases the density of the article to greater than about 90% of full density, alternatively about 90% to about 99% of full density, alternatively greater than about 99% of full density, alternatively about 99% to about 99.8% of full density, alternatively about 90% to about 99.8% of full density, or any value, range, or sub-range therebetween. When the article is formed by SLM, the densified component is preferably about 99% to about 99.8% of full density with only locations next to surfaces and internal feature surfaces having some porosity. In some embodiments, the densification increases the density of the article to substantially full density. In some embodiments, the densification increases the density of the article to full density. In some embodiments, the densified article is free or essentially free of near-surface porosity.

Since only a thin sealing layer is applied to the component surfaces, no additional material removal operations are needed to remove the sealing layer after densification.

After densification, the component may go through any regular heat treatment or coating steps, as desired or required for the appropriate material and component specification requirements.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A densified component comprising:
   a printed article having an external surface and at least one microfeature with an internal surface adjacent to the external surface, the internal surface of the at least one microfeature including a non-line-of-sight surface relative to the external surface, the at least one microfeature being an additively manufactured feature with a predetermined structure and the printed article being formed by additive manufacture with a porosity such that the printed article is not at full density, the porosity including surface-connected porosity at the external surface and at the internal surface; and
   a metallic microlayer coating the external surface of the printed article and the internal surface of the at least one microfeature, including coating the non-line-of-sight surface of the at least one microfeature, to seal the surface-connected porosity of the printed article by overlaying the surface-connected porosity along the external surface and the internal surface,
   wherein the metallic microlayer is formed of a material other than pure nickel.

2. The component of claim 1, wherein the component is a gas turbine component.

3. The component of claim 1, wherein the microfeature is a microchannel.

4. The component of claim 1, wherein the metallic microlayer has a thickness in the range of about 5 µm to about 100 µm.

5. The component of claim 1, wherein the metallic microlayer has a thickness in the range of about 30.5 µm to about 63.5 µm.

6. The component of claim 1, wherein the printed article and the metallic microlayer are formed of a material independently selected from the group consisting of a nickel-based alloy and a cobalt-based alloy.

7. The component of claim 1, wherein the printed article is iron-based and the metallic microlayer is formed of a material selected from the group consisting of a nickel-based alloy, a cobalt-based alloy, and an iron-based alloy.

8. The component of claim 1, wherein the non-line-of-sight surface includes at least one surface-connected porosity.

9. The component of claim 8, wherein the metallic microlayer seals the at least one surface-connected porosity.

10. The component of claim 8, wherein the metallic microlayer covers all surface-connected porosity.

11. The component of claim 1, wherein the component is greater than 90% of full density.

12. The component of claim 1, wherein the printed article is formed of a superalloy including a composition, by weight, selected from the group consisting of between about 9.3% and about 9.7% tungsten (W), between about 9.0% and about 9.5% cobalt (Co), between about 8.0% and about 8.5% chromium (Cr), between about 5.4% and about 5.7% aluminum (Al), about 3.2% tantalum (Ta), about 1.4% hafnium (Hf), up to about 0.25% silicon (Si), up to about 0.1% manganese (Mn), between about 0.06% and about 0.09% carbon (C), incidental impurities, and a balance of nickel (Ni); between about 9% and about 10% Co, between about 9.3% and about 9.7% W, between about 8.0% and about 8.7% Cr, between about 5.25% and about 5.75% Al, between about 2.8% and about 3.3% Ta, between about 1.3% and about 1.7% Hf, up to about 0.9% titanium (Ti), up to about 0.6% molybdenum (Mo), up to about 0.2% iron (Fe), up to about 0.12% Si, up to about 0.1% Mn, up to about 0.1% copper (Cu), up to about 0.1% C, up to about 0.1% niobium (Nb), up to about 0.02% zirconium (Zr), up to about 0.02% boron (B), up to about 0.01% phosphorus (P), up to about 0.004% sulfur (S), incidental impurities, and a balance of Ni; about 9.75% Cr, about 7.5% Co, about 4.2% Al, about 3.5% Ti, about 4.8% Ta, about 6% W, about 1.5% Mo, up to about 0.5% Nb, up to about 0.2% Fe, up to about 0.2% Si, up to about 0.15% Hf, up to about 0.08% C, up to about 0.009% Zr, up to about 0.009% B, incidental impurities, and a balance of Ni; between about 15.7% and about 16.3% Cr, about 8.0% to about 9.0% Co, between about 3.2% and about 3.7% Ti, between about 3.2% and about 3.7% Al, between about 2.4% and about 2.8% W, between about 1.5% and about 2.0% Ta, between about 1.5% and about 2.0% Mo, between about 0.6% and about 1.1% Nb, up to about 0.5% Fe, up to about 0.3% Si, up to about 0.2% Mn, between about 0.15% and about 0.20% C, between about 0.05% and about 0.15% Zr, up to about 0.015% S, between about 0.005% and about 0.015% B, incidental impurities, and a balance of Ni; between about 13.70% and about 14.30% Cr, between about 9.0% and about 10.0% Co, between about 4.7% and about 5.1% Ti, between about 3.5% and about 4.1% W, between about 2.8% and about 3.2% Al, between about 2.4% and about 3.1% Ta, between about 1.4% and about 1.7% Mo, about 0.35% Fe, about 0.3% Si, about 0.15% Nb, between about 0.08% and about 0.12% C, about 0.1% Mn, about 0.1% Cu, about 0.04% Zr, between about 0.005% and about 0.020% B, about 0.015% P, about 0.005% S, incidental impurities, and a balance of Ni; about 12% Co, about 6.8% Cr, about 6.4% Ta, about 6.1% Al, about 4.9% W, about 2.8% rhenium (Re), about 1.5% Mo, about 1.5% Hf, about 0.12% C, about 0.02% Zr, about 0.015% B, incidental impurities, and a balance of Ni; about 13% Cr, about 7.5% Co, about 6.6% Al, about 5% Ta, about 3.8% W, about 1.6% Re, about 0.15% Hf, incidental impurities, and a balance of Ni; and about 22.5% Cr, about 19% Co, about 2% W, about 1.35% Nb, about 2.3% Ti, about 1.7% Al, about 0.1% C, incidental impurities, and a balance of Ni.

13. The component of claim 1, wherein the printed article is formed of a superalloy including a composition, by weight, selected from the group consisting of about 29% Cr, about 10% Ni, about 7% W, about 1% Fe, about 0.7% Mn, about 0.75% Si, about 0.25% C, about 0.01% B, incidental impurities, and a balance of Co; between about 21% and about 23% Cr, between about 20% and about 24% Ni, between about 13% and about 15% W, up to about 3% Fe, up to about 1.25% Mn, between about 0.2% and about 0.5% Si, between about 0.05% and about 0.15% C, between about 0.03% and about 0.12% lanthanum (La), up to about 0.02% P, up to about 0.015% B, up to about 0.015% S, incidental impurities, and a balance of Co; between about 19% and about 21% Cr, between about 14% and about 16% W, between about 9% and about 11% Ni, up to about 3% Fe, between about 1% and about 2% Mn, between about 0.05% and about 0.15% C, up to about 0.4% Si, up to about 0.04% P, up to about 0.03% S, incidental impurities, and a balance of Co; and between about 22.5% and about 24.25% Cr, between about 9% and about 11% Ni, between about 6.5% and about 7.5% W, between about 3% and about 4% Ta, up to about 0.3% Ti, up to about 0.65% C, up to about 0.55% Zr, incidental impurities, and a balance of Co.

14. The component of claim 1, wherein the printed article is formed of a superalloy including a composition, by weight, selected from the group consisting of about 42.5% Ni, about 12.5% Cr, about 5.75% Mo, about 2.9% Ti, up to about 1% Co, up to about 0.5% Cu, up to about 0.5% Mn, up to about 0.4% Si, up to about 0.35% Al, up to about 0.1% C, up to about 0.03% S, incidental impurities, and a balance of Fe; and between about 15% and about 17.5% Cr, between about 3% and about 5% Ni, between about 3% and about 5% Cu, up to about 1% Mn, up to about 1% Si, between about 0.15% and about 0.45% Nb plus Ta, up to about 0.07% C, up to about 0.04% P, up to about 0.03% S, incidental impurities, and a balance of Fe.

15. A densified component comprising:
a printed article having an external surface and at least one microfeature with an internal surface, adjacent to the internal surface, the internal surface of the at least one microfeature including a non-line-of-sight surface relative to the external surface, the at least one microfeature being an additively manufactured feature with a pre-determined structure and the printed article being formed of an article material selected from the group consisting of a nickel-based superalloy, a cobalt-based superalloy, and an iron-based superalloy, and being formed by additive manufacture with a porosity such that the printed article is not at full density, the porosity including surface-connected porosity at the external surface and at the internal surface; and
a metallic microlayer coating the external surface of the printed article and the internal surface of the at least one microfeature, including coating the non-line-of-sight surface of the at least one microfeature, to seal the surface-connected porosity of the printed article by overlaying the surface-connected porosity along the external surface and the internal surface,
wherein the metallic microlayer coating has a coating composition other than pure nickel and is selected from the group consisting of nickel-based, cobalt-based, and iron-based materials.

16. The component of claim 15, wherein the component is a gas turbine component.

17. The component of claim 15, wherein the microfeature is a microchannel.

18. The component of claim 15, wherein the metallic microlayer has a thickness in the range of about 5 μm to about 100 μm.

19. The component of claim 1, wherein the metallic microlayer is a braze material having a melting point temperature greater than a temperature of densification of the printed article and a portion of the braze material fills the surface-connected porosity of the non-line-of-sight surface of the inner surface.

* * * * *